United States Patent [19]

Warfield

[11] Patent Number: 5,411,629

[45] Date of Patent: May 2, 1995

[54] METHOD FOR ROUGHENING SURFACE OF HALOCARBON FILM

[75] Inventor: Timothy J. Warfield, Tempe, Ariz.

[73] Assignee: Motorola, Inc., Schaumburg, Ill.

[21] Appl. No.: 829,193

[22] Filed: Feb. 3, 1992

[51] Int. Cl.⁶ ............................................. H01L 21/00
[52] U.S. Cl. ..................................... 216/34; 252/79.1; 216/83
[58] Field of Search ................... 156/668, 629, 637; 252/79.1

[56] References Cited

U.S. PATENT DOCUMENTS

| | | | |
|---|---|---|---|
| 4,791,038 | 12/1988 | Shia et al. | 429/218 |
| 4,830,714 | 5/1989 | Sirinyan et al. | 427/97 |
| 4,913,762 | 4/1990 | Kittler | 156/272.6 |
| 5,006,411 | 4/1991 | Motonari et al. | 428/421 |

FOREIGN PATENT DOCUMENTS 63-120745  5/1988  Japan .

OTHER PUBLICATIONS

"Handbook of Adhesive Bonding"; ed. Cagle; ©1982; p. 27; McGraw-Hill Publishers.

Primary Examiner—R. Bruce Breneman
Assistant Examiner—George Goudreau
Attorney, Agent, or Firm—Joe E. Barbee; Rennie William Dover

[57] ABSTRACT

A method for roughening a principal surface (12) of a halocarbon film (11). The halocarbon film (11) is treated with a colloidal suspension wherein the colloidal suspension includes light metal atoms. The light metal atoms combine with halogen atoms of the halocarbon film, thereby toughening the principal surface (12) and giving the principal surface (12) a burnt appearance.

12 Claims, 1 Drawing Sheet

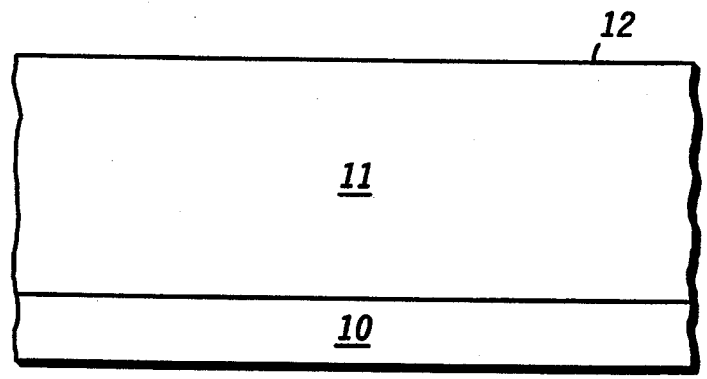
FIG. 1
FIG. 2
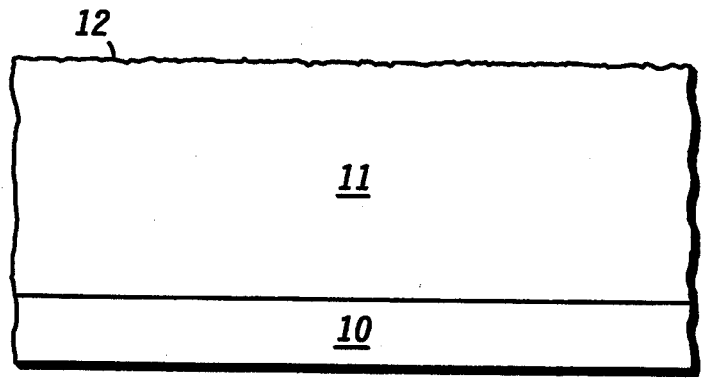

5,411,629

METHOD FOR ROUGHENING SURFACE OF HALOCARBON FILM

BACKGROUND OF THE INVENTION

This invention relates, in general, to halocarbon films, and more particularly to halocarbon films having other films disposed thereon.

VLSI and ULSI circuitry require multilevel-interconnect structures to improve the speed and functional density of integrated circuits. In these structures, layers of dielectric material are interdigitated with layers of conductive material to electrically isolate the layers of conductive material from each other. Manufacturers of semiconductor circuits have employed a variety of materials to serve as interlayer, as well as intralayer, dielectric films such as silicon dioxide, nitride, spin-on glass, and polyimide films. Dielectric materials are selected based on a number of criteria including a desired dielectric constant, an ability of the dielectric film to adhere to other films, and ease of incorporation into semiconductor manufacturing processes. A more thorough list of desirable properties for interlayer and intralayer dielectric material may be found on page 195 of "Silicon Processing for the VLSI Era," Vol. 2, by Stanley Wolf.

A particularly useful dielectric material for multilayer structures is a polyimide film. Polyimide films offer low dielectric constants and produce relatively planar surfaces. More importantly, polyimide films are easy to deposit and pattern, thus are ideally suited for integration into semiconductor manufacturing processes. Further, polyimide films are inexpensive. Unfortunately, conductive films do not adhere well to polyimide. Motonari et al., in U.S. Pat. No. 5,006,411, entitled "Polyimide Film Having Fluorocarbon Resin Layer," have taught a technique for improving adhesion of a metal to a polyimide film, wherein a fluorocarbon resin is provided over a surface of the polyimide film. However, this technique requires treating a surface of the polyimide film and a surface of the fluorocarbon resin with a corona discharge. In addition, the two films are pressed together with a press roller. The technique requires a substantial mechanical pressure to bond the films, therefore it is somewhat impractical to use in the manufacture of semiconductor devices.

A dielectric material with similar properties to a fluorocarbon coated polyimide film is a halocarbon film. Like the coated polyimide film, halocarbon films have low dielectric constants, promote surface planarization, are easy to deposit and pattern, and are inexpensive. Unlike the coated polyimide film, the halocarbon film is comprised of a single type of film which may be applied in a liquid state. However, upon curing other films are unable to adhere to a surface of the halocarbon film. Accordingly, it would be advantageous to have a method for altering a surface of the halocarbon film to promote adhesion by other materials, particularly conductive materials, that is inexpensive and easily integrated into semiconductor processing techniques.

SUMMARY OF THE INVENTION

Briefly stated, the present invention is a method for toughening a surface of a halocarbon film. A principal surface of the halocarbon film is treated with a colloidal suspension consisting essentially of an aprotic ether solvent and a metal from Group IA or Group IIA of the periodic table. The reaction is terminated by rinsing the colloidal suspension from the principal surface with an aprotic solvent, wherein the aprotic solvent may be the same type aprotic solvent used in the colloidal suspension.

BRIEF DESCRIPTION OF THE DRAWINGS

FIG. 1 illustrates a highly enlarged cross-sectional view of a portion of a substrate having a halocarbon film disposed thereon; and FIG. 2 illustrates a highly enlarged cross-sectional view of the halocarbon film of FIG. 1 having a roughened top surface in accordance with the present invention.

DETAILED DESCRIPTION OF THE DRAWINGS

FIG. 1 illustrates a highly enlarged cross-sectional view of a portion of a substrate 10 having a halocarbon film 11 disposed thereon. Halocarbon film 11 has a top surface 12, commonly referred to as a principal surface 12, wherein principal surface 12 is characterized as smooth and planar. The smooth and planar characteristics of principal surface 12 hinder adhesion of other films to principal surface 12, particularly adhesion by conductive films. It should be understood that halocarbon film 11 is applied in a liquid state which allows adhesion of halocarbon film 11 to substrate 10. However, after applying halocarbon film 11 to substrate 10, halocarbon film 11 cures and assumes a solid state having a principal surface 12 with smooth and planar characteristics. Preferably, halocarbon film 11 is, for example, a fluorocarbon film.

Halocarbon film 11 comprises a saturated alkylhalide polymeric chain having carbon atoms covalently bonded to halogen atoms. Halogen atoms are characterized as being strongly electronegative. The single covalent bonds provide the smooth characteristics of principal surface 12 of halocarbon film 11. In order to promote adhesion to principal surface 12, principal surface 12 is reacted with a colloidal suspension. The reaction extracts a plurality of halogen atoms from principal surface 12 and renders principal surface 12 rough or coarse. Portions of halocarbon film 11 reacted with the colloidal suspension are commonly referred to as being decomposed or as having formed a decomposed resin.

Preferably, the colloidal suspension comprises an aprotic ether solvent that is polar and viscous such as, for example, tetrahydrofuran, commonly referred to as THF. It shall be understood that tetrahydrofuran is not a limitation of the present invention and that other aprotic ether solvents may be used. Further, it should be understood that the ether solvent may be either a cyclic or an open chain compound. Because tetrahydrofuran is a volatile chemical, a stabilizing agent such as, for example, napthalene may be dissolved in the tetrahydrofuran. Napthalene retards evaporation and water absorption by the tetrahydrofuran.

A metal from Group IA or IIA of the periodic table, commonly referred to as alkali or alkaline earth metals respectively, is mixed with the aprotic ether solvent. The Group IA and Group IIA metals are collectively referred to as light metals because they do not have high densities relative to solid nonmetals. Preferably, the light metal is calcium although other light metals may be used. Alkali and alkaline earth metals are characterized as being strongly electropositive. Therefore, alkali and alkaline earth metals are strongly solvated in aprotic solvents.

In a preferred embodiment, the colloidal suspension consists essentially of ten grams of napthalene dissolved in one hundred milliliters of tetrahydrofuran. A gram of calcium is mixed with the solution containing the tetrahydrofuran and napthalene forming a colloidal suspension. It should be understood that the amount of the light metal is not a limitation of the present invention. In other words, the amount of light metal may be adjusted to provide a desired thickness of the decomposed resin of surface 12.

The colloidal suspension is applied to principal surface 12 of halocarbon film 11, shown in FIG. 1, in a liquid form. Halocarbon film 11 may be for example a fluorocarbon film 11. As those skilled in the art will understand, there are many ways to introduce a liquid to a planar surface. For example, the liquid may be dispensed from a nozzle to the planar surface by dispensers such as those used to dispense photoresist and polyimide films. Another example entails dipping the planar surface 12 in a reservoir containing the liquid to be applied to the planar surface. Once the liquid or colloidal suspension of the present invention contacts principal surface 12, the strongly electropositive light metal atom of the colloidal suspension combines with a strongly electronegative fluorine atom of the halocarbon film converting principal surface 12 into a decomposed resin. The loss of the halogen atom leaves a partially filled electron cloud, capable of accepting an electron In the example of a fluorocarbon film, the halogen atom is a fluorine atom.

Referring now to FIG. 2, the partially filled electron cloud renders principal surface 12 of halocarbon film 11 rough or coarse and appearing burnt. The reaction may be terminated by rinsing principal surface 12 with an aprotic polar solvent such as, for example, tetrahydrofuran. Moreover, the polar solvent serves to rinse reaction by-products from principal surface 12. A stabilizing agent may be mixed with the aprotic polar solvent. For example, a stabilizing agent such as napthalene may be mixed with the aprotic solvent tetrahydrofuran wherein the napthalene retards evaporation and water absorption by the tetrahydrofuran. Therefore, principal surface 12 requires an electron to fulfill the valence bond requirements of the carbon atom from which the halogen was extracted. The electron is readily obtained from a film or a conductive pattern provided on the electron deficient halocarbon film thereby promoting adhesion of the provided film to the halocarbon film.

By now it should be appreciated that there has been provided an inexpensive method for roughening the principal surface of halocarbon films. The method takes advantage of the affinity between halogen elements of the halocarbon film and light metal atoms of a colloidal suspension wherein the light metal atoms extract some of the halogen atoms resulting in a rough or coarse principal surface of the halocarbon film.

The deposition of the halocarbon film is readily integrated into a semiconductor process to serve as both interlayer and intralayer dielectric material. Moreover, the principal surface of the halocarbon film is planar, promoting a planar surface for subsequent layers formed on the principal surface of the halocarbon film. In addition, the method for roughening the principal surface is easily integrated into a standard semiconductor fabrication process. Other advantages include the low dielectric constant of the halocarbon film, the ease of etching the halocarbon film using standard etch techniques, and the ability to perform the roughening process at room temperature.

I claim:

1. A method for roughening a surface of a halocarbon film to promote adhesion to the halocarbon film, comprising the steps of:
   providing a colloidal suspension, wherein the colloidal suspension consists essentially of a mixture of an ether solvent and a plurality of metal atoms selected from Group IIA elements of a periodic table;
   applying the colloidal suspension to a top surface of the halocarbon film; and
   rinsing the top surface of the halocarbon film with the ether solvent.

2. The method for roughening a surface of a halocarbon film of claim 1, wherein the colloidal suspension further comprises a stabilizing agent for stabilizing the ether solvent.

3. The method for roughening a surface of a halocarbon film of claim 1, wherein the step of providing a colloidal suspension further includes forming the colloidal suspension by mixing a gram of calcium with 100 milliliters of tetrahydrofuran.

4. The method for roughening a surface of a halocarbon film of claim 1, wherein the step of providing a colloidal suspension further includes forming the colloidal suspension by mixing one gram of calcium with a solution comprising ten grams of napthalene mixed with 100 milliliters of tetrahydrofuran.

5. A method for extracting halogen elements from a halocarbon film thereby increasing a surface roughness of the halocarbon film, which comprises:
   providing a halocarbon film having a principal surface;
   reacting the principal surface with a light metal suspension, wherein the light metal is selected from Group IIA elements of a periodic table and
   rinsing the principal surface with an aprotic solvent.

6. The method for extracting halogen elements from a halocarbon film of claim 5 further including forming the light metal suspension by mixing the light metal with the aprotic solvent.

7. The method for extracting halogen elements from a halocarbon film of claim 5, wherein the aprotic solvent includes a stabilizing agent.

8. A method for converting a halocarbon film to a decomposed resin to promote adhesion to the halocarbon film, comprising the steps of:
   providing the halocarbon film;
   treating the halocarbon film with a suspension consisting essentially of an aprotic solvent, a stabilizing agent, and a light metal selected from Group IIA elements of a periodic table; and
   terminating the step of treating the halocarbon film by rinsing the treated halocarbon film with the aprotic solvent.

9. A light metal solution capable of reacting with a halocarbon film, comprising:
   an aprotic polar solvent; and
   a light metal, wherein the light metal is an alkaline earth metal and exists as a colloidal suspension in the aprotic polar solvent.

10. The light metal solution of claim 9 wherein the aprotic polar solvent is tetrahydrofuran and the light metal is calcium in the amounts of one gram of calcium for every 100 milliliters of tetrahydrofuran.

11. The light metal solution of claim 9 wherein the aprotic polar solvent has a stabilizing agent to retard evaporation of the aprotic polar solvent and retard water absorption by the aprotic polar solvent.

12. The light metal solution of claim 9 wherein the aprotic polar solvent is tetrahydrofuran, the stabilizing agent is napthalene, and the light metal is calcium in the amounts of one gram of calcium and ten grams of napthalene for every 100 milliliters of tetrahydrofuran.

* * * * *